(12) United States Patent
Peters

(10) Patent No.: US 9,465,705 B2
(45) Date of Patent: Oct. 11, 2016

(54) PROCESSING A TARGET MEMORY

(71) Applicant: Infineon Technologies AG, Neubiberg (DE)

(72) Inventor: Christian Peters, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 113 days.

(21) Appl. No.: 14/252,925

(22) Filed: Apr. 15, 2014

(65) Prior Publication Data

US 2015/0293824 A1   Oct. 15, 2015

(51) Int. Cl.
| | |
|---|---|
| G06F 11/00 | (2006.01) |
| G06F 11/20 | (2006.01) |
| G11C 16/34 | (2006.01) |
| G11C 29/44 | (2006.01) |
| G11C 29/50 | (2006.01) |
| G06F 11/10 | (2006.01) |
| G11C 29/04 | (2006.01) |

(52) U.S. Cl.
CPC ....... *G06F 11/2094* (2013.01); *G11C 16/3445* (2013.01); *G11C 29/4401* (2013.01); *G11C 29/50004* (2013.01); *G06F 11/1068* (2013.01); *G11C 2029/0409* (2013.01)

(58) Field of Classification Search
CPC . G06F 11/2094; G06F 11/1068; G06F 11/00
See application file for complete search history.

(56) References Cited

U.S. PATENT DOCUMENTS

| | | | | |
|---|---|---|---|---|
| 5,978,273 A | * | 11/1999 | Shigemura | G11C 16/16 365/185.09 |
| 6,381,174 B1 | * | 4/2002 | Roohparvar | G11C 8/12 365/185.09 |
| 2002/0054507 A1 | * | 5/2002 | Makuta | G11C 29/789 365/185.09 |

* cited by examiner

*Primary Examiner* — Charles Ehne
(74) *Attorney, Agent, or Firm* — Schiff Hardin LLP

(57) ABSTRACT

A method is suggested for processing a target memory, the method comprising the steps of (i) checking the target memory subsequent to an erase operation directed to the target memory; and (ii) replacing the target memory with a spare memory in case a defect is detected.

18 Claims, 4 Drawing Sheets

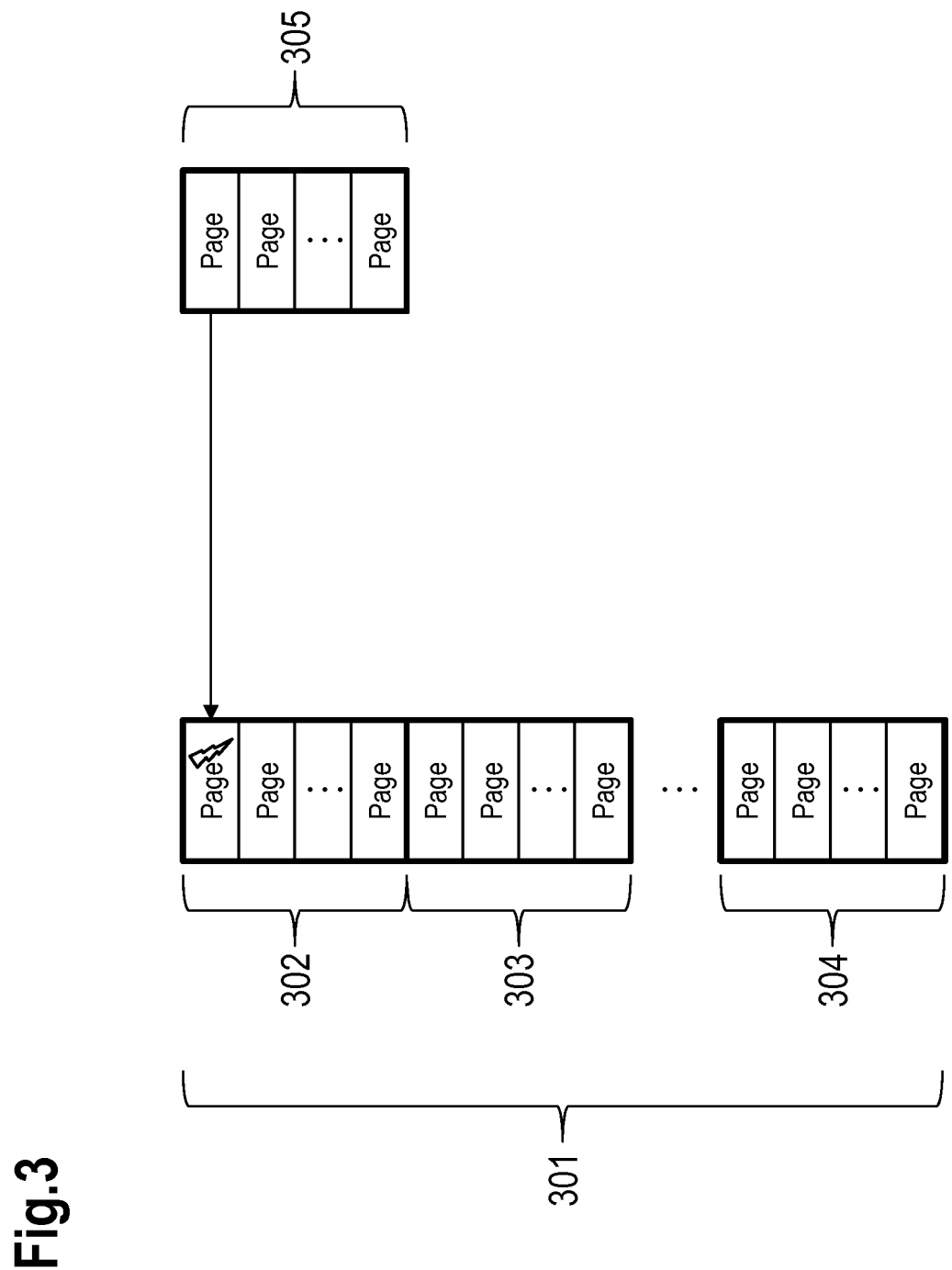

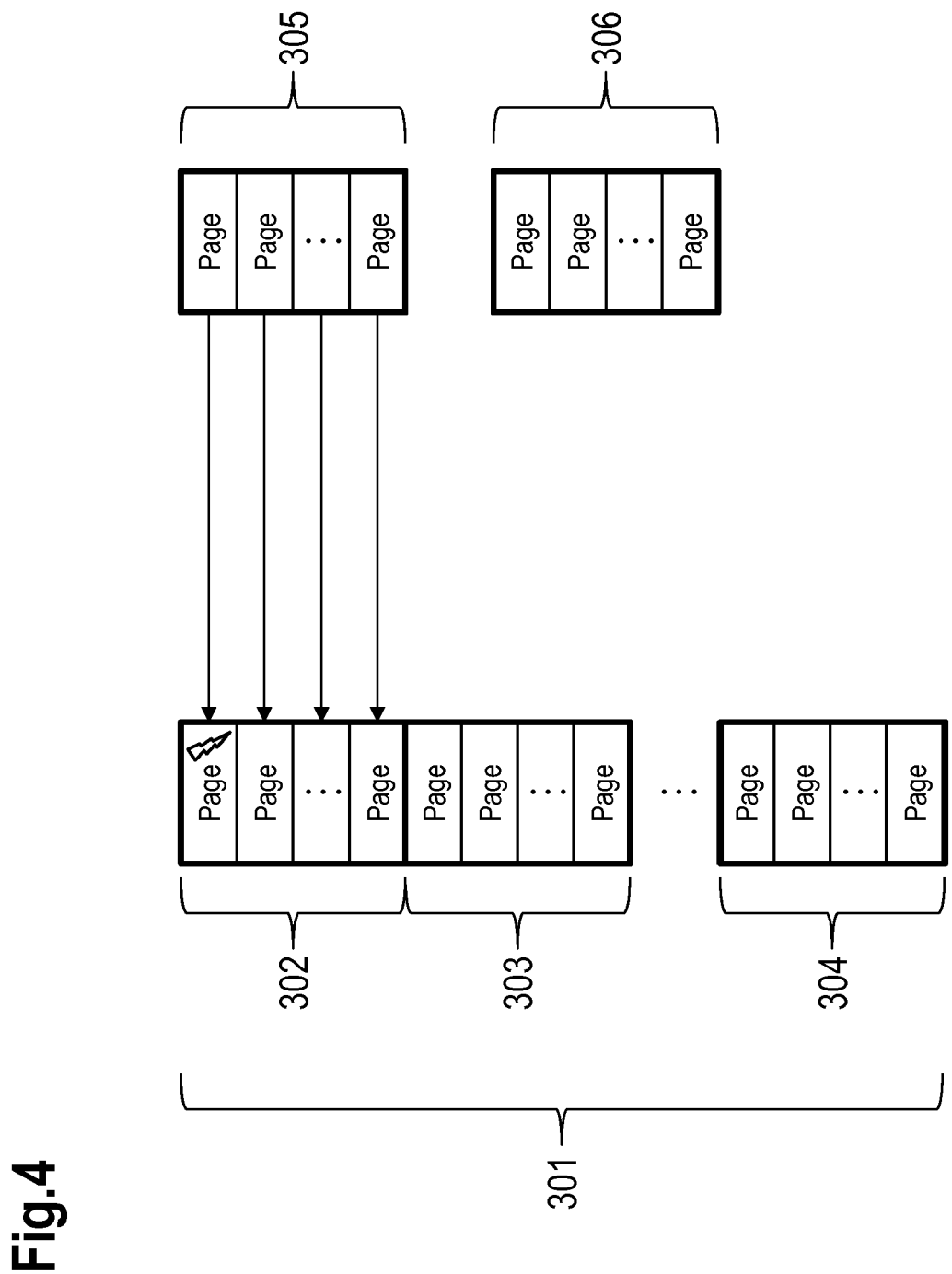

PROCESSING A TARGET MEMORY

BACKGROUND OF THE INVENTION

Embodiments of the present invention relate to a method and a device for processing a target memory, in particular to efficiently continue using a memory for an application even in case of a failure of a memory cell of the memory.

SUMMARY

A first embodiment relates to a method for processing a target memory, the method comprising the steps:
  checking the target memory subsequent to an erase operation directed to the target memory;
  replacing the target memory with a spare memory in case a defect is detected.

A second embodiment relates to a device for processing a target memory, the device comprising a processing unit that is arranged for:
  checking the target memory subsequent to an erase operation directed to the target memory;
  replacing the target memory with a spare memory in case a defect is detected.

A third embodiment relates to a computer program product directly loadable into a memory of a digital computer, comprising software code portions for performing the steps of the method as described herein.

A fourth embodiment is directed to a computer-readable medium, e.g., storage of any kind, having computer-executable instructions adapted to cause a computer system to perform the method as described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 3 shows a schematic diagram visualizing the online repair page operation;

FIG. 4 shows a schematic diagram visualizing the online repair sector operation.

DETAILED DESCRIPTION OF THE PREFERRED EMBODIMENTS

Figure 1:
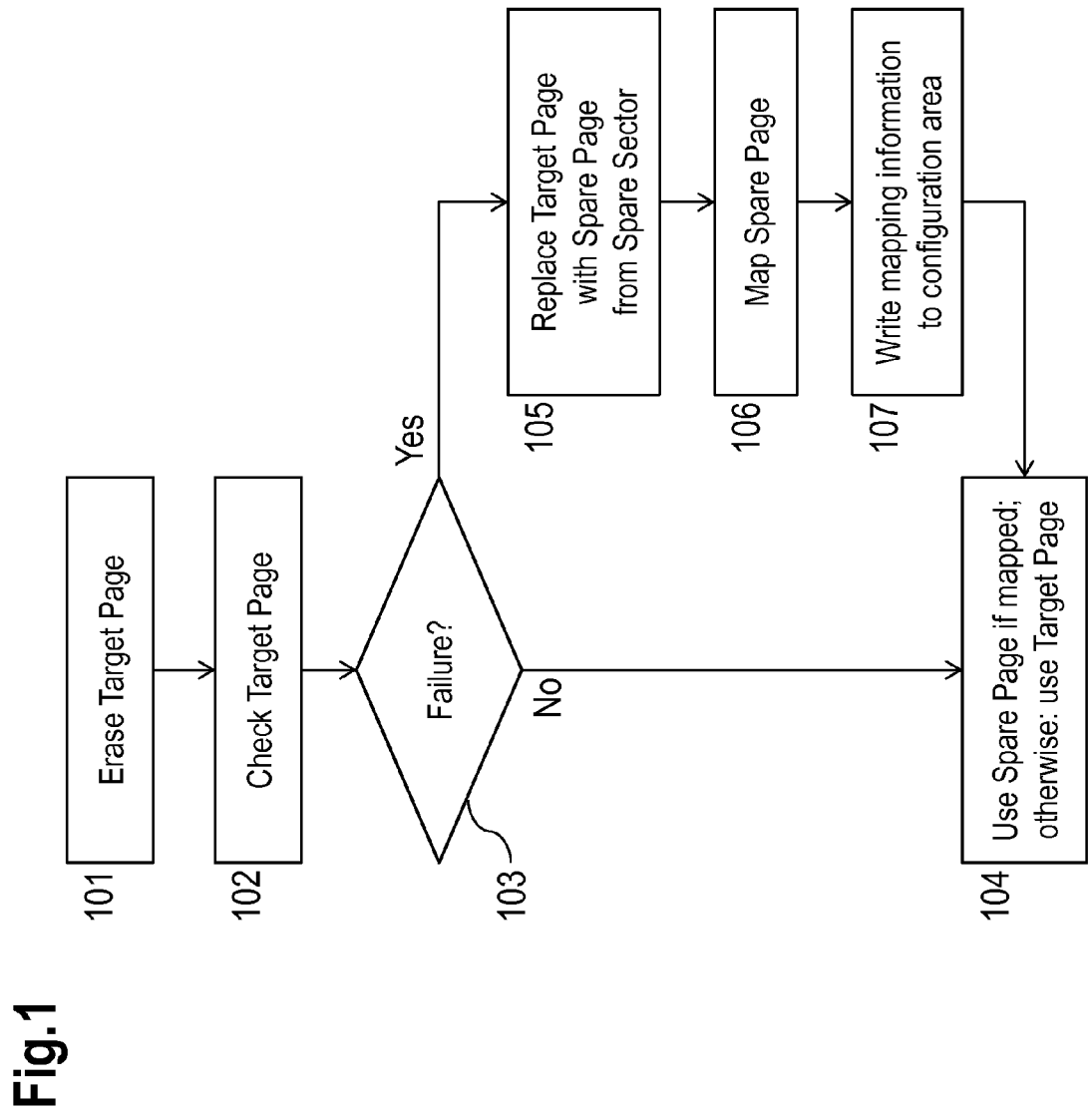
FIG. 1 shows a schematic flow chart comprising steps of an online repair page erase operation.

Memory cells, e.g., flash cells, may experience local defects introduced during a manufacturing process. Such local defect may lead to a weakness in an isolation between the memory cell and other structures like, e.g., source or drain contacts. Voltages used for programming the memory cell and (maybe different) voltages used for erasing the memory cell or a memory area (e.g., page or sector) that comprises the memory cell may lead to a break-down of the isolation and thus at least one defect memory cell.

After the manufacturing process of the memory cells, a test program may be run to test the memory cells prior to them being sold or being placed into service. However, the test program may not reveal all defect memory cells or all potentially defect memory cells. In particular, some memory cells may deteriorate over time and reach their defect state after being placed into service. In addition, the test program is time-consuming and expensive and may not cover all defects in some products.

The memory cells may be flash memory cells embedded memory cells, e.g. FLASH or EEPROM memory cells in stand-alone or embedded devices.

Examples provided herewith introduce an online repair concept that allows reducing the impact of possible defects of memory cells. Such online repair concept can be used on memory cells that are already implemented and used in a device. The solution in particular determines at least one defect memory cell and provides a measure to not use this at least one defect memory cell. It is noted that the term "repair" may refer to the result that the functionality of a logical memory area is maintained, although a target memory may have been replaced by a spare memory. In this regard, "repair" includes the meaning of replacement by a spare memory (portion).

Also, examples provided may utilize a combination of page and sector erase operations for one spare memory portion, i.e. spare sector, which comprises several spare pages. For example, a spare page of the spare sector may be used instead of a target page (of a target sector) in case the erase of the target page shows a failure. Also, the spare sector may be used instead of the target sector in case the erase of the target sector shows a failure.

The examples presented do not require moving data to a different location and remapping the address information (to the different location). Such movement of data is time consuming and bears the risk that data may get lost if the power supply is interrupted during such data movement.

Advantageously, the solutions presented detect and repair (e.g., circumvent) errors that occur during an erase operation. Thus, no customer data has to be transferred.

Also, the approach allows handling of failures of at least one memory cell during a sector erase or a page erase of a memory area and may be fully transparent (invisible) for the normal user operation. Preferably, data that should not be erased may not be affected by the failure handling suggested herein.

The approach presented may in particular be implemented in software, hardware and/or firmware.

Advantageously, a spare memory portion (e.g., a spare sector) is provided and can be used for the repair operation. The spare memory portion may be tested and/or erased during a production test.

As an example, a (mapping) information about the use of the spare memory portion may be stored in a non-volatile configuration area that can be used for restoring data after a power-up.

Example

Online Repair Page Erase Operation

FIG. 1 shows a schematic flow chart comprising steps of an online repair page erase operation.

It is noted that a target page is a memory portion of a memory comprising several memory cells. The target memory (memory currently in use) may comprise several (target) sectors, wherein each (target) sector may comprise several (target) pages.

The target page may comprise defective memory cells, which are determined during an erase operation of the target page. The erase operation may be directed to the whole page, i.e. all memory cells of the target page are erased by the erase operation.

A spare sector may be provided comprising several spare pages. A spare page can be used to replace a target page. The spare sector may have the same dimension as any of the target sectors. Optionally, several spare sectors may be provided.

In a step 101, the target page is erased. After the erase operation, in a step 102, the target page is checked. Such check may comprise read operations to verify erased data. In a step 103 it is checked whether a failure occurred during the check of the target page. If no failure occurred, next is a step 104 which uses the spare page, if this spare page is mapped, e.g., in a configuration (memory) area.

If a failure has been detected in step 103, it is branched to a step 105. In this step 105 the target page is replaced by a spare page of the spare sector. The spare page may have the same physical position within the spare sector as the target page has within the target sector.

Next, in a step 106, the spare page is mapped and in a step 107 the mapping information is written to the configuration area to indicate which memory portion to be used by the system or program.

The configuration area may be checked during a start-up process to determine whether or not a spare page is to be used and which target page is replaced by the spare page.

Subsequent to the step 107, the step 104 indicates that the spare page is used as from now because of the mapping information found in the configuration area.

FIG. 3 shows a schematic diagram visualizing the online repair page operation. A (target) memory 301 comprises several target sectors 302 to 304, wherein each of the target sectors 302 to 304 comprises several target pages. An erase operation for the target memory 301 can be directed to a single target page of any of the target sectors 302 to 304 or to any of the target sectors 302 to 304.

An exemplary spare sector 305 has the same physical structure as any of the target sectors 302 to 304, i.e. comprising the same number of pages. In the example shown in FIG. 3, the first target page in the target sector 302 has (at least one) defective cell, which has been revealed during a check operation after an erase operation applied to this target cell. The first spare page of the spare sector 305 is then used to replace this target page.

A mapping information stored in a configuration area ensures that the data can be found in the currently used physical memory portion, e.g., the spare page(s) of the sector 305.

Example

Online Repair Sector Erase Operation

Figure 2:
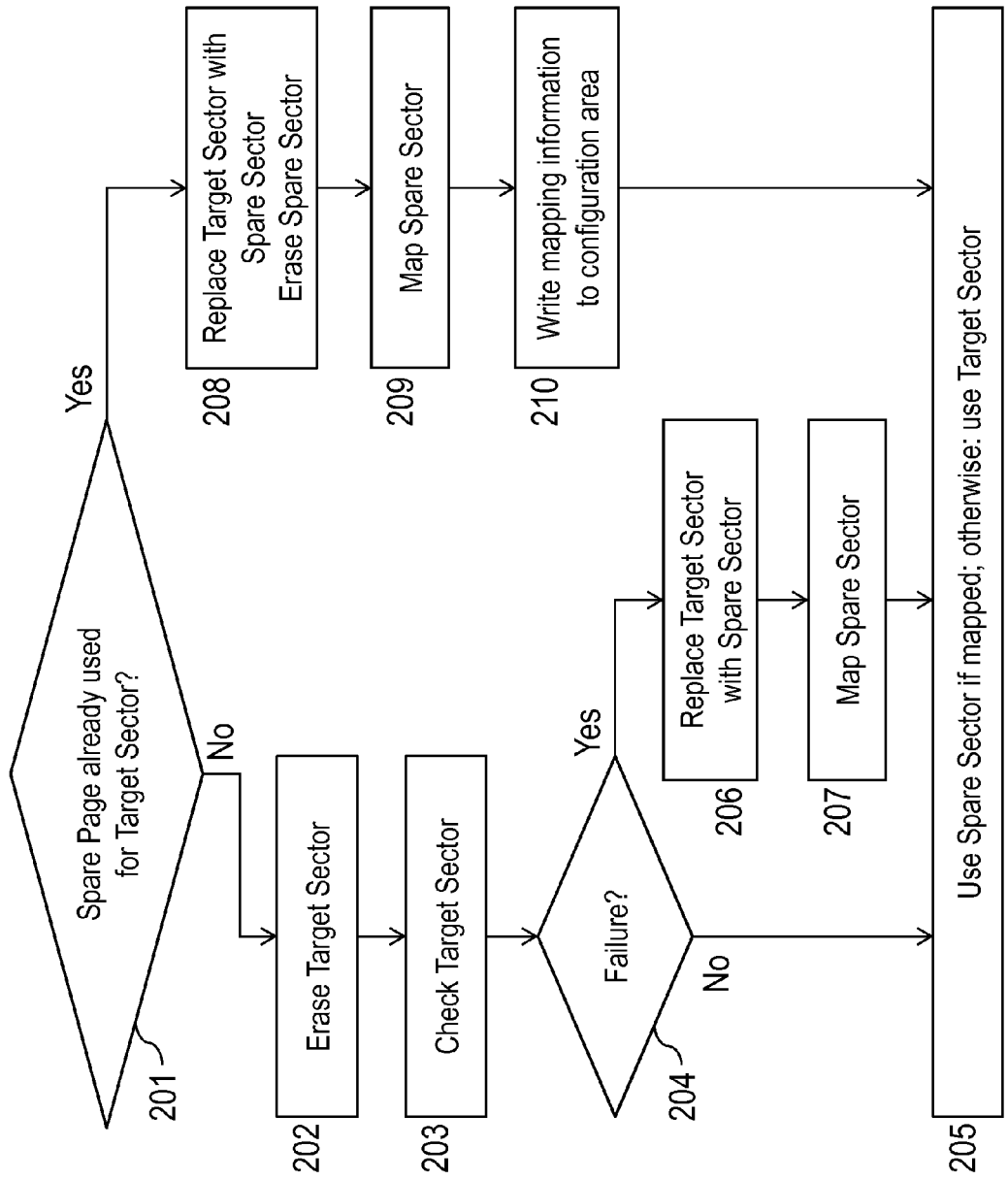
FIG. 2 shows a schematic flow chart comprising steps of an online repair page erase operation.

FIG. 2 shows a schematic flow chart comprising steps of an online repair sector erase operation.

In a step 201 it is checked whether a spare page of a spare sector is already in use for the target sector. If this is the case, at least one memory cell in a target page of the target sector is defective and for this target page a spare page has already been mapped. Hence, in a subsequent step 208 (assuming that there is a spare page used in the target sector) the target sector is replaced by the spare sector. Then, the spare sector is erased. In a next step 209, the spare sector is mapped and in a step 210 the mapping information is written to the configuration area in order to use the spare sector instead of the target sector. In a next step 205 the spare sector is used if mapped in the configuration area; otherwise, the target sector is used.

The configuration area may be checked during a start-up process to determine whether or not a spare page (or spare sector) is to be used and which target page (or target sector) is replaced by the spare page (or spare sector). For this purposes, the configuration area may comprise two entries (for each spare sector available). Both entries may initially be erased. The spare page may be written to the first entry and the spare sector may be written to the second entry.

If—during start-up—the first entry is not empty and the second entry is empty, the information of the first entry is used to determine which page of the spare sector is to be used instead of the respective page of which target sector. Optionally, several pages may be identified to replace several pages of one target sector by the respective pages of the spare sector.

If—during start-up—the second entry is not empty, the second entry determines which target sector is replaced by the spare sector.

As an option, several spare sectors may be provided. In such case, the configuration area may provide two entries for each of the spare sectors to allow determining (during start-up) which target page(s) and/or target sector(s) is/are replaces by which spare page(s) and/or spare sector(s).

If step 201 reveals that no spare page of the spare sector is used for the target sector, the target sector is erased in a step 202. In a subsequent step 203, the target sector is checked. Such check may comprise read operations to verify erased data in all target pages of the target sector. In a step 204 it is checked whether a failure occurred during the check of the target sector. If no failure occurred, next is the step 205, which uses (as the spare sector was not mapped) the target sector.

If a failure has been detected in step 204, it is branched to a step 206. In this step 206 the target sector is replaced by the spare sector. In a next step 207, the spare sector is mapped in the configuration area in order to use the spare sector instead of the target sector. Next is the step 205 which indicates using the previously mapped spare sector instead of the target sector.

FIG. 4 shows a schematic diagram visualizing the online repair sector operation. FIG. 4 is based on FIG. 3. Instead of a mere spare page utilization, the whole spare sector 305 is used to replace the target sector 302 due to a failure in the first target page of the target sector. Such replacement occurs subsequent to an erase operation directed to the sector 302. Accordingly, all spare pages of the spare sector 305 are used instead of the target pages of the target sector 302.

It is noted that several spare sectors (indicated by a second spare sector 306) may be provided in case additional failures of memory cells occur and target pages and/or target sectors need replacement after an erase operation.

Further Advantage(s) and Embodiment(s)

It is an advantage that no user data needs to be moved. The approach suggested is in particular triggered by an erase operation and supplies a transparent mechanism to repair target memory areas based on such an erase operation. As a result of the erase operation requested, an erased target or (if a failure was detected) an erased spare memory area is provided. Considering the lifetime of a device, the approach is efficient and does not significantly worsen the time required for the erase operation.

The examples suggested herein may in particular be based on at least one of the following solutions. In particular combinations of the following features could be utilized in order to reach a desired result. The features of the method could be combined with any feature(s) of the device, apparatus or system or vice versa.

A method is suggested for processing a target memory, the method comprising the steps:
  checking the target memory subsequent to an erase operation directed to the target memory;
  replacing the target memory with a spare memory in case a defect is detected.

Hence, due to an erase operation, the target memory is checked.

The defect may be a single defect or it may be a number of defects reaching and/or exceeding a predetermined threshold. The defect may be determined, e.g., in case an existing error correction code (ECC) does not suffice to correct the error. The defect may in particular be based on a defective memory cell determined based on a read operation.

If the check reveals such defect, the target memory is replaced with the spare memory.

Preferably, the target memory may be a portion of a memory that is used by or for operating a device. The target memory that is subject to the erase operation may have the same size and/or structure as the spare memory.

Hence, the solution advantageously allows a transparent repair operation on a defective or partly defective target memory.

In an embodiment, the target memory has the same size or structure as the spare memory.

In an embodiment, the method comprises the step:
  not replacing the target memory with a spare memory in case no defect is detected.

In an embodiment, the target memory is an area of a memory that is as a whole subject to the erase operation.

Hence, the target memory (as well as the spare memory) may correspond to a memory area that is completely erased by the erase operation.

In an embodiment, the method comprises the step after replacing the target memory with the spare memory:
  mapping the spare memory to be used instead of the target memory.

As an example, a mapping information about the use of the spare memory portion may be stored in a non-volatile configuration area that can be used for restoring data after a power-up.

In an embodiment, the target memory comprises memory cells of a flash memory.

In an embodiment, the target memory comprises a page and the spare memory comprises a page.

In an embodiment, the target memory comprises a target sector and wherein the spare memory comprises a spare sector, wherein each sector comprises several pages.

In an embodiment, the method comprises the steps:
  checking the target page subsequent to an erase operation directed to the target page;
  replacing the target page with the spare page in case a defect is detected.

In an embodiment, the method comprises the steps:
  if a spare page of the spare sector was already in use for the target sector conducting the steps:
    replacing the target sector with the spare sector;
    erasing the spare sector;
    mapping the spare sector to be used instead of the target sector;
  if a spare page of the spare sector was not in use for the target sector conducting the steps:
    erasing the target sector;
    checking the target sector;
    replacing the target sector with the spare sector and mapping the spare sector to be used instead of the target sector in case a defect is detected;
    mapping the spare sector to be used instead of the target sector.

In an embodiment, the method comprises the step:
  not replacing the target sector with the spare sector in case no defect is detected.

In an embodiment, the spare memory is tested during a production test.

The spare memory, e.g., spare sector or page, may be tested and/or erased before it is placed into service, e.g., during a production test.

A device is provided for processing a target memory, the device comprising a processing unit that is arranged for:
  checking the target memory subsequent to an erase operation directed to the target memory;
  replacing the target memory with a spare memory in case a defect is detected.

It is noted that the steps of the method stated herein may be executable on this processing unit as well.

It is further noted that said processing unit can comprise at least one, in particular several means that are arranged to execute the steps of the method described herein. The means may be logically or physically separated; in particular several logically separate means could be combined in at least one physical unit.

Said processing unit may comprise at least one of the following: a processor, a microcontroller, a hard-wired circuit, an ASIC, an FPGA, a logic device.

In an embodiment, the device comprises the target memory and the spare memory.

In an embodiment, the target memory has the same size or structure as the spare memory.

In an embodiment, the processing unit is arranged for:
  not replacing the target memory with a spare memory in case no defect is detected.

In an embodiment, the target memory comprises memory cells of a flash memory.

In an embodiment, the target memory comprises a page and the spare memory comprises a page.

In an embodiment, the target memory comprises a target sector and wherein the spare memory comprises a spare sector, wherein each sector comprises several pages.

In an embodiment, the processing unit is arranged for conducting the steps:
  if a spare page of the spare sector was already in use for the target sector conducting the steps:
    replacing the target sector with the spare sector;
    erasing the spare sector;
    mapping the spare sector to be used instead of the target sector;
  if a spare page of the spare sector was not in use for the target sector conducting the steps:
    erasing the target sector;
    checking the target sector;
    replacing the target sector with the spare sector and mapping the spare sector to be used instead of the target sector in case a defect is detected;
    mapping the spare sector to be used instead of the target sector.

A computer program product is provided, which may be directly loadable into a memory of a digital computer, comprising software code portions for performing the steps of the method as described herein.

Also, a computer-readable medium is suggested, having computer-executable instructions adapted to cause a computer system to perform the method as described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for processing a target memory, the method comprising:
    checking the target memory subsequent to an erase operation directed to the target memory; and
    replacing the target memory with a spare memory in case a defect is detected,
    wherein the target memory comprises a target sector and wherein the spare memory comprises a spare sector, wherein each sector comprises several pages;
    if a spare page of the spare sector was already in use for the target sector conducting:
        replacing the target sector with the spare sector;
        erasing the spare sector; and
        mapping the spare sector to be used instead of the target sector;
    if a spare page of the spare sector was not in use for the target sector conducting:
        erasing the target sector;
        checking the target sector;
        replacing the target sector with the spare sector and mapping the spare sector to be used instead of the target sector in case a defect is detected; and
        mapping the spare sector to be used instead of the target sector.

2. The method according to claim 1, wherein the target memory has the same size or structure as the spare memory.

3. The method according to claim 1, further comprising:
    not replacing the target memory with a spare memory in case no defect is detected.

4. The method according to claim 1, wherein the target memory is an area of a memory that is as a whole subject to the erase operation.

5. The method according to claim 1, further comprising, after replacing the target memory with the spare memory:

mapping the spare memory to be used instead of the target memory.

6. The method according to claim 1, wherein the target memory comprises memory cells of a flash memory.

7. The method according to claim 1, wherein the target memory comprises a page and the spare memory comprises a page.

8. The method according to claim 1, further comprising:
checking the target page subsequent to an erase operation directed to the target page;
replacing the target page with the spare page in case a defect is detected.

9. The method according to claim 1, further comprising:
not replacing the target sector with the spare sector in case no defect is detected.

10. A method for processing a target memory, the method comprising:
checking the target memory subsequent to an erase operation directed to the target memory; and
replacing the target memory with a spare memory in case a defect is detected,
wherein the spare memory is tested during a production test.

11. A device for processing a target memory, the device comprising a processing unit that is arranged for:
checking the target memory subsequent to an erase operation directed to the target memory; and
replacing the target memory with a spare memory in case a defect is detected;
wherein the processing unit is arranged for conducting:
if a spare page of the spare sector was already in use for the target sector conducting:
replacing the target sector with the spare sector;
erasing the spare sector; and
mapping the spare sector to be used instead of the target sector; and
if a spare page of the spare sector was not in use for the target sector conducting:
erasing the target sector;
checking the target sector;
replacing the target sector with the spare sector and mapping the spare sector to be used instead of the target sector in case a defect is detected; and
mapping the spare sector to be used instead of the target sector.

12. The device according to claim 11, wherein the device comprises the target memory and the spare memory.

13. The device according to claim 11, wherein the target memory has the same size or structure as the spare memory.

14. The device according to claim 11, wherein the processing unit is arranged for:
not replacing the target memory with a spare memory in case no defect is detected.

15. The device according to claim 11, wherein the target memory comprises memory cells of a flash memory.

16. The device according to claim 11, wherein the target memory comprises a page and the spare memory comprises a page.

17. The device according to claim 11, wherein the target memory comprises a target sector and wherein the spare memory comprises a spare sector, wherein each sector comprises several pages.

18. A non-transitory computer-readable medium, having computer-executable instructions adapted to cause a computer system to perform the method according to claim 1.

* * * * *